United States Patent [19]
Sato et al.

[11] Patent Number: 5,905,282
[45] Date of Patent: May 18, 1999

[54] MULTI-TERMINAL SURGE PROTECTION DEVICE

[75] Inventors: Masaaki Sato, Hachioji; Mitsuru Inoue, Kanagawa-ken; Yasuharu Yamada, Sagamihara; Akihiro Kasai, Sagamihara; Hideyuki Harada, Sagamihara; Hirofumi Yoshihara, Hamura, all of Japan

[73] Assignees: Sankosha Corporation, Tokyo; Optotechno Co., Ltd., Sagamihara, both of Japan

[21] Appl. No.: 08/856,997

[22] Filed: May 15, 1997

[30] Foreign Application Priority Data

May 16, 1996 [JP] Japan ................................. 8-144879

[51] Int. Cl.$^6$ ........................... H01L 29/792; H01L 23/62
[52] U.S. Cl. .......................... 257/328; 257/355; 257/356; 257/357; 257/361
[58] Field of Search .................................. 257/328, 355, 257/356, 357, 358, 359, 360, 361, 362, 363

[56] References Cited

U.S. PATENT DOCUMENTS

| | | |
|---|---|---|
| 4,282,555 | 8/1981 | Svedberg . |
| 4,905,119 | 2/1990 | Webb . |
| 5,083,185 | 1/1992 | Hayashi et al. . |
| 5,371,385 | 12/1994 | Hayashi et al. . |
| 5,376,809 | 12/1994 | Hayashi et al. . |
| 5,486,709 | 1/1996 | Hayashi et al. . |

FOREIGN PATENT DOCUMENTS

| | | |
|---|---|---|
| 1-33951 | 7/1989 | Japan . |
| 2-52862 | 11/1990 | Japan . |
| 4-320067 | 11/1992 | Japan . |
| 4-78186 | 12/1992 | Japan . |
| 6-38507 | 5/1994 | Japan . |
| 6-38508 | 5/1994 | Japan . |
| 6-56885 | 7/1994 | Japan . |
| 7-7837 | 1/1995 | Japan . |
| 7-70740 | 7/1995 | Japan . |
| 7-77268 | 8/1995 | Japan . |
| 7-93423 | 10/1995 | Japan . |
| 7-93424 | 10/1995 | Japan . |

Primary Examiner—Carl Whitehead, Jr.
Attorney, Agent, or Firm—Oblon, Spivak, McClelland, Maier & Neustadt, P.C.

[57] ABSTRACT

A multi-terminal surge protection device able to absorb surges of either polarity between lines and between a line and ground, in which the difference in operating time between the device elements connected to lines is reduced. A plurality of unipolar surge protection device elements are used which only operate to absorb surges of a specific polarity, and do not exhibit a reverse withstand characteristic upon application of a reverse-polarity voltage. One element is connected to a first line and another element to a second line, while a different element is connected to ground. A semiconductor substrate and second electrode are used that are common to all elements. To prevent lateral interference between elements, at least the element connected to ground is isolated from the line elements.

15 Claims, 6 Drawing Sheets

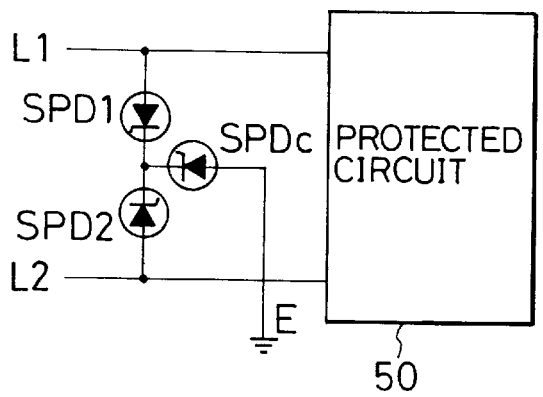
FIG.11A
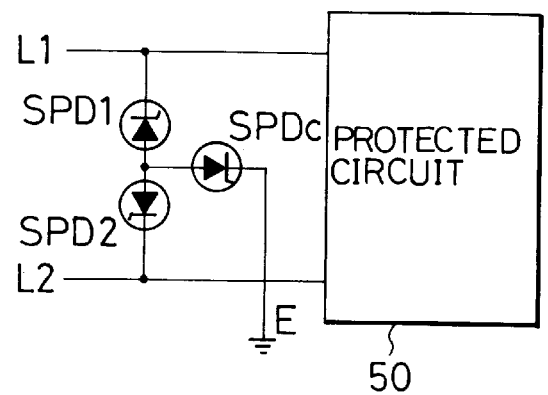
FIG.11B
FIG.12A PRIOR ART
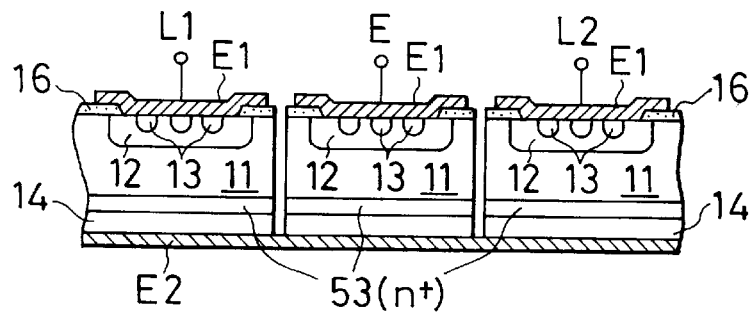
FIG.12B PRIOR ART
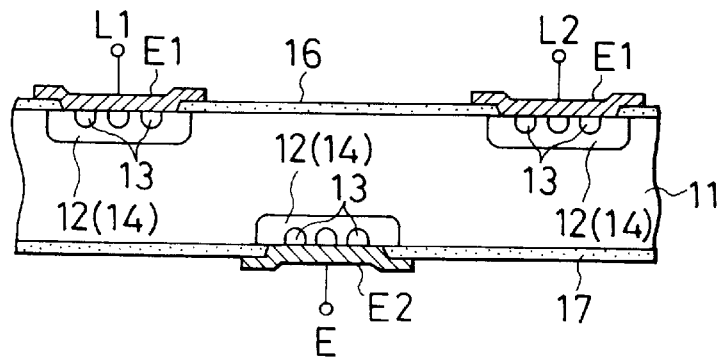

MULTI-TERMINAL SURGE PROTECTION DEVICE

BACKGROUND OF THE INVENTION

1. Field of the Invention

This invention relates to a surge protection device for protecting electrical circuits from abnormally high voltages and currents caused by, for example, lightning, switching surges and the like. More particularly, this invention relates to a multi-terminal surge protection device that incorporates a multiplicity of surge protectors and is able to absorb surges of either polarity between any of a plurality of telecommunication or power supply lines or the like and ground, and between any two of a plurality of lines.

2. Description of the Prior Art

The number of unipolar surge protection devices that have been devised is considerable, even when only two-terminal surge protectors are considered. Among these are the basic or classical type of surge protector, namely, a constant-voltage diode type (breakdown type) surge protector that clamps the voltage across the device terminals at a fixed breakdown voltage at the time of breakdown caused by a surge. Then there are breakover type surge protectors that are not limited to clamping the voltage across the device terminals at a fixed breakdown voltage at the time of breakdown caused by occurrence of a surge, but instead also exhibit negative characteristics when the device current that begins to flow at the time of the device breakdown increases to above the breakover current value. As a result, the voltage across the terminals after breakdown is shifted to a clamp voltage that is lower than the breakdown voltage, making it possible to absorb large current surges.

The surge protection devices of this type have a number of excellent features, including low power consumption, so they therefore generate less heat, and the ability to absorb large surges. Some of the surge protection elements of this type utilize an avalanche or Zener breakdown mechanism, while others use a punch-through breakdown mechanism. The present invention can be applied to both breakdown type and breakover type surge protectors. Insofar as a general comparison goes, those using the punch-through breakdown mechanism are more advantageous in a number of ways. They provide a broad range of design options that enable the breakdown voltage to be selected freely, and also allow various electrical properties such as junction capacitance and resistivity to be designed independently. For some time, the inventors have therefore been focussing on improvements to breakover type surge protection elements utilizing the punch-through principle. Examples of the results of these efforts are described in a number of patent applications, including the following listed in the order of the earlier filing date.

Reference No. 1: JP-B Hei 7-77268;
Reference No. 2: JP-B Hei 1-33951;
Reference No. 3: JP-B Hei 2-52862;
Reference No. 4: JP-B Hei 4-78186;
Reference No. 5: JP-B Hei 6-38507;
Reference No. 6: JP-B Hei 6-38508;
Reference No. 7: JP-B Hei 6-56885;
Reference No. 8: JP-B Hei 7-7837;
Reference No. 9: JP-B Hei 7-70740;
Reference No. 10: JP-A Hei 4-320067;
Reference No. 11: JP-B Hei 7-93423;
Reference No. 12: JP-B Hei 7-93424.

It is noted that References Nos. 1 to 4 are claimed as the Convention priorities in U.S. Pat. No. 5,083,185 and that References Nos. 7, 8 and 12 are claimed as the Convention priorities, respectively, in U.S. Pat. No. 5,376,809, U.S. Pat. No. 5,371,385 and U.S. Pat. No. 5,486,709.

The improvements disclosed by References Nos. 7 to 11 can in fact be applied to breakover type surge protectors that utilize an avalanche or Zener breakdown mechanism. The basic structure and operation of a punch-through type surge protector will be explained with reference to FIG. 10. With reference to FIG. 10(A) showing a sectional view of the device element structure, the element has a first semiconductor region 11 constituted by a semiconductor wafer or a semiconductor substrate. The first semiconductor region 11 can be of either n or p conductivity type. In the illustrated device element it is of n type. A second semiconductor region 12 and a third semiconductor region 13 are successively formed on one principal surface of the semiconductor region 11, ordinarily by double impurity diffusion, selective ion-implantation or other such technique of doping an appropriate impurity. Since the second semiconductor region 12 has to form a rectifying junction (a pn junction) with the first semiconductor region 11, in the illustrated example it is selected to be of p type. In the case of a punch-through type device element, it is preferable for it to be of a somewhat low concentration p type, namely, $p^-$ type. The third semiconductor region 13 should be of a type having properties that allow the injection of minority carriers with respect to the second semiconductor region 12. That is, third semiconductor region 13 should be a region that with second semiconductor region 12 forms a minority carrier injection junction. For example, if the second semiconductor region 12 is n type it can be fabricated of silicide that permits the injection of holes, while if it is p type it can be fabricated of metal that enables the injection of electrons. Generally, however, the third semiconductor region 13 is also a semiconductor region, as in the illustrated case. Thus, the third semiconductor region 13 is of opposite conductivity type from the second semiconductor region 12 and forms a rectifying junction (pn junction) with the second semiconductor region 12. In the illustrated case, it is therefore of n conductivity type. Since as explained later, however, the third semiconductor region 13 constitutes one end of the main device current path after breakdown, it preferably has high conductivity and, therefore, is preferably a high concentration ($n^+$) semiconductor region. This would also apply to other devices to which the invention is applied, as described below.

A fourth semiconductor region 14 having properties that allow injection of minority carriers with respect to the first semiconductor region 11 is further formed on the other principal surface of the first semiconductor region 11 (the bottom surface in the drawing), so as to face the second semiconductor region 12. As in the case of the third semiconductor region 13, if the first semiconductor region 11 is a p-type semiconductor this fourth semiconductor region 14 could be formed of metal, and if the first semiconductor region 11 is an n-type semiconductor the fourth semiconductor region 14 could be formed of silicide or the like. In principle this can also apply in the case of the device elements described below which use the invention. However, the fourth region 14 will usually be a semiconductor region that is used to form a rectifying junction (pn junction) with the first semiconductor region 11. Thus, as shown, to form a minority carrier injection junction with the first semiconductor region 11 the fourth semiconductor region 14 is formed of a p-type semiconductor. For the same reason described with respect to third semiconductor region 13, region 14 is preferably a high concentration (p⁺) semiconductor region. This can also apply to the embodiments of the invention described below. Thus, regions 13 and 14 which are not limited to semiconductor regions as well as regions 11 and 12 which should be semiconductor regions will hereinafter be collectively referred to simply as "regions."

With further reference to the structural aspects shown in FIG. 10(A), a first ohmic electrode E1 is provided in common ohmic contact with the second region 12 and third region 13, via an opening in an insulation film 16, while a second ohmic electrode E2 is provided in ohmic contact with the fourth region 14, via an opening in an insulation film 17. The second electrode E2 also has a portion in contact with the first region 11, forming an ohmic contact region 18. In this sectional configuration this surge protection device element is formed with the regions 11, 12, 13 and 14 stacked vertically in the thickness direction of the first region 11. Moreover, as will be clear from the explanation of the device's operation given later, the device current resulting from surge absorption flows in the thickness direction of the first region 11, between the third and fourth regions 13 and 14. The device can therefore be said to be of the vertical type. In contrast, there are also prior art surge protection devices of the lateral type in which the fourth region 14 is situated on the same principal surface of the first region 11 as the second region 12, side by side therewith. Since there is little difference in operating principle between the vertical and lateral devices and the present invention does not use the lateral type, only the vertical structure will be explained here.

The surge absorption operation of the surge protector shown in FIG. 10(A) will now be described. For simplicity, it will be assumed that there is no ohmic contact region 18 (that is, that the second electrode E2 is in contact only with the surface of the fourth region 14). When a surge voltage arises across the first and second electrodes E1 and E2 at a relatively large magnitude and in such phase as to apply a reverse bias across the pn junction (rectifying junction) between the first region 11 and the second region 12 (in the illustrated case, such that the first electrode E1 becomes negative), the upper extremity of the depletion layer produced at the pn junction between the first and second regions 11 and 12 reaches the third region 13, whereby punch-through is established. It is preferable for the region 12 to be a low concentration p⁻ type region so that the depletion layer extends mainly toward the third region 13.

When punch-through occurs, a portion of the minority carriers, from the viewpoint of the first region 11, injected into the first region 11 from the fourth region 14 via the forward biased minority carrier injection junction (in this case, a pn junction) between fourth and first regions 14 and 11, are nullified by association with minority carriers of opposite polarity from the third region 13 that have punched through the second region 12 and flowed into the first region 11, but most reach the second region 12 which has become a space-charge layer. As a result of the current flow path established with the first electrode E1 in contact with the surface of the second region 12 and the existence of the electrical field created by the surge, the carriers move laterally along the surface of the third region 13 and then upward along the side surface, reaching the first electrode E1 in contact with the surface of the second region 12. As a result, device current, namely, current resulting from the absorption of the surge, starts to flow between the two electrodes E1 and E2. The voltage at which this operation starts is termed the breakdown voltage $V_{BR}$, or operating voltage, on the illustrated surge protector voltage axis of the voltage-vs-current (V-I) characteristic curve shown in FIG. 10(B).

Even if the second region 12 and the third region 13 should be shorted at their surfaces by mutual connection with the first electrode E1 following this start of minority carrier flow from the fourth region 14, once the device current begins to flow via the second region 12 and rises to the point that the product between itself and the resistance along the path thereof in the second region 12 (the voltage drop) becomes equal to the forward voltage at the minority carrier injection junction formed between the second region 12 and the third region 13 (a pn junction, in the illustrated example), the junction turns on so that minority carriers (from the viewpoint of the second region 12) are injected from the third region 13 into the second region 12. This injection of minority carriers into the second region 12 causes the device current flowing between the first and second electrodes E1 and E2 to become even larger, as indicated in FIG. 10(B) by the portion of the characteristic curve which rises rapidly in the direction of the current axis. Since this in turn promotes the injection of minority carriers from the fourth region 14 into the first region 11, a positive feedback is obtained that expands the turned-on portion of the minority carrier injection junction between the regions 12 and 13. When the junction is thus turned on over virtually the whole of its surface, a principal current path is established within the device, making it possible for a large current to be absorbed between the third and fourth regions 13 and 14.

Thus, as can be seen from the characteristic curve in FIG. 10(B), when the current flowing between the first and second electrodes E1 and E2 becomes greater than the value indicated as the breakover current $I_{BO}$, the occurrence of positive feedback within the device manifests itself in the form of a negative resistance characteristic. As a result, the voltage across the first and second electrodes E1 and E2 shifts to a clamp voltage (or ON voltage) $V_P$ that is lower than the breakover voltage $V_{BO}$ at which breakover commenced and also lower than the breakdown voltage $V_{BR}$ at which punch-through first started. Therefore, the device is able to absorb large surge currents while holding down the amount of heat it generates.

The maximum current which the surge protection device can absorb across its first and second electrodes E1 and E2 is generally referred to as its "surge current capability" $I_{PP}$. On the other hand, the minimum device current capable of maintaining the device in its on state after it has once turned on is called its "hold current" $I_H$. Stated differently, once the surge has subsided and a current equal to or larger than the hold current $I_H$ no longer flows through the device, the device automatically resets itself (turns off) to the state at the beginning of this explanation. Because of this, the hold current $I_H$ is also referred to as the "turn-off current."

The above operation basically arises even when the second region 12 and third region 13 are not shorted at their surfaces by the first electrode E1, but are each connected to its own terminal and these terminals are used to draw off the current and short it outside the device. With such an arrangement, however, there is a high possibility of there being a considerable variation in breakdown voltage $V_{BR}$ (and by extension, breakover voltage $V_{BO}$ depending on the magnitude of the time differential value (dV/dt) of the voltage produced by the application of the surge transient based on the resistance and inductance of the shorting line or shorting means. In other words, by using the first electrode E1 to produce a short across the surfaces of the second and third regions 12 and 13, that fear can be reduced and the breakdown voltage $V_{BR}$ (breakover voltage $V_{BO}$) stabilized.

As will be understood from the foregoing, the illustrated surge protection device element can absorb surges of a specific polarity. Specifically, with respect to the conductivity arrangement of regions 11 to 14, the device element can absorb a surge only if it causes the second electrode E2 to become positive. Moreover, as described below, since also the second electrode E2 is connected directly with the first region 11 via the ohmic contact region 18, the device element does not exhibit a significant reverse withstand characteristic upon application of a surge voltage of reverse polarity. It will simply be the same as if the forward-bias diode comprised by first region 11 and second region 12 were interposed between the first and second electrodes E1 and E2. The illustrated device element can therefore be called a "unipolar" surge protection device that is limited with respect to the polarity of the surge it can absorb. "Bipolar" surge protection devices able to absorb surges of both polarities, irrespective of which of the first and second electrodes E1 and E2 becomes positive, have been disclosed, together with unipolar devices, by the inventors in the above-listed publications (with the exception of Reference Nos. 3, 6 and 10). Since the present invention does not use such bipolar surge protectors, or surge protectors having a reverse withstand characteristic upon application of a voltage of reverse polarity, description thereof is omitted.

With the explanation of the operating principle relating to surge absorption by the surge protectors shown in FIG. 10 completed, the reason why the second electrode E2 is in electrical contact not only with the fourth region 14 but is also in ohmic contact with the first region 11 to the side of the fourth region 14, as shown by ohmic contact region 18 in FIG. 10(A), will now be explained.

Originally this type of surge protection device was designed not to respond to a surge having an absolute voltage value at or below the design specification breakover voltage $V_{BO}$. However, with devices having a structure in which there was no second electrode E2 in ohmic contact with the first region 11 on the fourth region 14 side, breakover would sometimes occur when it should not even when the absolute voltage of the surge applied across the first and second electrodes E1 and E2 was smaller than the breakover voltage $V_{BO}$. This can be explained by the following.

For a pn junction formed by the first region 11 and second region 12 to be reversely biased when a surge is applied, a junction capacitance Cj can be expected to be present at the junction, so application of a surge with a transient voltage time differential value (dV/dt) between the first and second electrodes E1 and E2 will produce a transient displacement current iT that charges this junction capacitance Cj, this displacement current being $$iT = (dV/dt) Cj \quad (1)$$

Increasing the area of each region to obtain sufficient surge current capability will usually produce a considerable increase in the junction capacitance Cj of equation (1), to around 100 pF or so. Many detailed studies and investigations have been conducted into the properties and behavior of various types of surge. Based on the results of these, when a telephone system line, for example, is subjected to a surge, even when the induced noise voltage has a relatively low peak value, a surge intensity of around 100 V/µS is easily possible. As shown when this value is substituted into equation (1), the transient current iT for charging the junction capacitance will be around 10 mA, and will be higher if the dV/dt value is higher. In any case, a quite considerable displacement current iT flow can be obtained, if only for an instant.

In surge protection devices fabricated according to the sectional configuration shown in FIG. 10(A), the design distance between the fourth region 14 and the second region 12 is quite short to provide the necessary high-speed operation. In such a device element, perhaps because it can be impossible to make the breakover current $I_{BO}$ overly large and, in absolute terms, fabrication parameter based variation may not really be low enough, the breakover current $I_{BO}$ was sometimes little different from the displacement current iT obtained when a surge was applied as described above, or was lower.

There are a number of reasons for this. Although a surge may be so small that even at its peak the voltage does not reach the design breakover voltage $V_{BO}$ and therefore does not require absorption, if the surge is one with a very steep rise and therefore a large voltage time differential value dV/dt, it may induce breakover. In terms of the characteristic curve in FIG. 10(B), the effective breakover voltage $V_{BO}$ at which this misoperation occurred was considerably smaller than the value shown in the curve (that is, to the left).

In contrast, when the second electrode E2 in electrical contact with the fourth region 14 has an ohmic contact region 18 that is at the same time in electrical contact with the principal surface of the first region 11 in the vicinity of the fourth region 14, as shown in FIG. 10(A), even if a surge having a polarity that reversely biases the pn junction between first region 11 and second region 12, so that the junction between the regions 11 and 12 becomes forwardly biased, before the junction turns on majority carriers can flow into the first region 11 from the second electrode E2, via the ohmic contact region 18. Since this enables the rapid charging of the junction capacitance Cj of the pn junction formed by the first region 11 and second region 12, dV/dt immunity is increased.

This method was used to successfully obtain a surge protection device element that did not respond to "small surges." Also, first injecting majority carriers into the first region 11 for charging the junction capacitance was completed without adversely affecting basic operation following the occurrence of breakdown already described. Following punch-through between the first region 11 and the third region 13, as has been described, there is an increase in majority carrier current flow, and when the voltage drops mainly in the thickness direction (depth direction) of the fourth region 14 until it equalizes with the forwardly-biased voltage across the junction between the regions 14 and 11. Since at this point the injection of minority carriers from the fourth region 14 into the first region 11 starts, the device can go from breakdown to breakover, by the mechanism already described. Following breakover, the main device current path between the electrodes E1 and E2 is established not via the ohmic contact region 18 between second electrode E2 and first region 11, but via the third region 13 and fourth region 14. This is more or less the same as the state in a device not having the ohmic contact region 18.

Up to this point the description has been with reference to a punch-through type conventional device. In terms of sectional structure there is little difference from the structure shown in FIG. 10(A). However, the inventors found that by increasing the thickness of the second region 12 and third region 13, and by selecting appropriate geometric parameters and impurity concentration parameters and the like for each region, a positive-feedback type surge protection device could be fabricated that first utilizes an avalanche or Zener breakdown, and with respect to breakover, uses the same mechanism as a punch-through type device. They also found that when such surge protection devices, as well as other known surge protection devices, were of a type in which breakover was established through positive feedback accompanying the injection of minority carriers, and the same problem arose of response to "small surges," the above countermeasures were also applicable. Avalanche or Zener breakdown tends to occur at localized points or where there is a concentration of the electrical field, so that compared to punch-through devices, it is difficult to increase the surge current capability $I_{PP}$. There are also a number of other disadvantageous aspects such as limited design freedom and poor tolerance with respect to fabrication parameters. However, if such comparisons are disregarded and only dV/dt resistance is considered, the above reasoning can be applied almost unchanged to avalanche or Zener type surge protection devices. Such unipolar surge protection device elements can in fact also be used in the same way with respect to the invention described below. In surge protection devices that utilize avalanche or Zener breakdown between the first and second regions 11 and 12 as the initial breakdown mechanism, such as that described by Reference No. 8 with respect to FIG. 6, it is preferable to form localized areas in the area of the contact between the first and second regions 11 and 12 that have the same conductivity as first region 11 and have a higher impurity concentration than the first region 11. The reason is that despite the fact that this localized point occurrence is being utilized, it is possible to produce this avalanche or Zener breakdown process at all those localized points of high impurity concentration, which in overall terms helps to promote a uniform current distribution within the device element. As such, this technique can be similarly employed when this type of avalanche or Zener breakdown type unipolar surge protection device is used as a constituent element of the surge protection device of this invention.

Whatever the initial breakdown mechanism, there are practical structures which use a parallel multiplicity of third regions 13 in the second region 12 and a parallel multiplicity of fourth regions 14 to form minority carrier injection junctions with the first region 11. An aim of that arrangement is to increase the surge current capability $I_{PP}$ by achieving a uniform current distribution in the device. This arrangement can also be used in the case of the present invention, as described later with reference to the preferred embodiments.

An explanation will now be given with respect to applying the above-described type of surge protection device to the protection of communication system lines. Although it generally applies to surge absorption between any of $N(N \geq 2)$ transmission lines and ground E, or between any two of N signal lines, for simplicity the explanation will be made with reference to when N=2, namely, with reference to the protection of circuit 50, shown in FIGS. 11(A) and 11(B), which is balanced transmission type circuit having a pair of signal transmission lines (referred to hereinafter simply as "lines") L1 and L2.

In this type of balanced signal transmission system (including power line systems), geometrically speaking, lines L1 and L2 can both be regarded as being substantially symmetrical with respect to ground E, and this also applies with respect to a lightning-based power surge and transmission lines. Thus, as is well known, an abnormally high voltage produced by a surge would be applied to the lines L1 and L2 as a common-mode surge. When this abnormally high voltage exceeds the withstand voltage to ground of lines L1 and L2 of the circuit to be protected 50, dielectric breakdown takes place in the weakest portion in the circuit 15. Then, when dielectric breakdown takes place in one of the two lines L1 and L2 before the other, at that instant a high line-to-line voltage is produced between lines L1 and L2, a so-called normal-mode surge, and as a result of the line-to-line withstand voltage being exceeded, further dielectric breakdown takes place.

A common-mode or normal-mode surge is not limited to one polarity. For example, lightning surges are not always negative polarity surges, but may be positive polarity surges as typified by so-called winter lightning. As such, while using the above-described unipolar surge protectors in which the ability to absorb surges is limited to surges of a specific polarity, in terms of the device, there is a need to configure surge protection devices able to absorb surges of both polarities. For this purpose, it is advantageous to use the device configuration shown in FIG. 11(A) and 11(B) as it only requires a low number of device elements and the circuit arrangement is simple. In the arrangement shown in FIG. 11, absorption of a surge by breakdown and breakover only occurs when a surge of positive polarity applied to the cathode side of any of the three surge protection device elements SPD1, SPD2 and SPDc, and these device elements do not show a significant withstand voltage to an applied voltage having the reverse polarity. Thus, in the unipolar surge protection device element shown in FIG. 10(A) in which the first region 11 is constituted of n-type semiconductor, the second electrode E2 corresponds to the cathode-mark electrode. In a breakdown type device element such as a constant-voltage diode or the like, in accordance with normal notation, an n-type cathode region is formed on the cathode side.

With reference to FIG. 11(A), the terminals on the cathode side (hereinafter referred to simply as "cathode") of the three surge protection device elements SPD1, SPD2 and SPDc are connected together, while the anode side terminals (hereinafter referred to simply as "anode") are connected individually to the first line L1, second line L2 and ground E, respectively. In contrast, in the surge protection device element shown in FIG. 11(B), the polarities of the three surge protection device elements SPD1, SPD2 and SPDc are reversed, so that the anodes are connected, together and the cathodes are connected to the lines L1 and L2 and ground E.

Therefore, when there is no surge any only a normal voltage is being applied between the lines L1 and L2 and ground E, either the pair of device elements SPD1 and SPD2 or the device element SPDc will become reversely biased, which in effect is the same as being taken out of the circuit. In the same way, even when the difference in potential between the lines L1 and L2 is within a normal range, either SPD1 or SPD2 will become reversely biased, again effectively taking it out of the circuit with no adverse effect on the normal operation of the protected circuit 50. This means that even although an individual device element used is a unipolar surge protection device that does not itself exhibit a reverse withstand voltage, the surge protection device using the three device elements collectively can absorb line-to-ground and line-to-line surges of either polarity.

When a common-mode surge is applied such that the ground E side of the device element in FIG. 11(A) becomes positive and the ground E side of the device element in FIG. 11(B) becomes negative, the device element SPDc connected to ground E becomes forwardly biased and can be considered as being simply a conducting line, and the surge absorption operation is provided by the surge protection device elements SPD1, SPD2 connected to the lines L1 and L2. On the other hand, when a surge of reverse polarity is applied, it is the pair of surge protection device elements SPD1, SPD2 connected to the lines L1 and L2 that become simply a conducting line, and the surge absorption operation is performed by just the surge protection device element SPDc connected on the ground side. The problem becomes the difference in the characteristics of the surge protection device elements SPD1, SPD2 connected to the lines L1 and L2. From the above explanation, it can be understood that when the surge protection device element SPDc connected to ground E becomes a forwardly-biased diode and surge protection is effected by operation of surge protection device elements SPD1, SPD2 connected to the lines, normal-mode surge is produced the moment one of these device elements SPD1, SPD2 operates before the other, resulting in a large ground potential arising in the line connected to the surge protection device element that has not yet suffered breakdown. As far as possible, it is therefore preferable for there to be no characteristic differential between the device elements SPD1 and SPD2, so that even if it may be impossible for the two device elements to operate simultaneously, there is as small an operation time differential as possible. In contrast, the permissible characteristic differential between the pair of device elements SPD1 and SPD2 connected to the lines L1 and L2 and the device element SPDc connected to ground can be increased to some extent, as long as it does not exceed the specification standard value. This is because, as in the above-described operation, the pair of device elements SPD1 and SPD2 connected to the lines L1 and L2 and the device element SPDc connected to ground do not operate to absorb surges simultaneously. Either one or the other functions simply as a forwardly-biased diode.

To reiterate, it is necessary for there to be a low differential between the two surge protection device elements SPD1 and SPD2 which will be connected in an inverse series relationship between the lines, at least with respect to response time and breakover current characteristics. In practice, this means it is difficult to fabricate them from different semiconductor wafers, such as would be the case with commercially available products. The reason is that tolerance ranges for characteristic values of surge protection device elements cut from semiconductor wafers in chip units are defined that take into account variations with respect to the mother wafers and the overall fabrication processes and variations between production lots. Thus, even if the characteristic values of individual device elements are within the allowable limits, there is a strong possibility that the characteristic differentials would be too large for application with the present type of surge protection device. As known, since a wafer can exhibit quite a difference in resistivity (impurity concentration) between the center and peripheral portions, device elements fabricated from the same wafer can exhibit quite a difference in characteristics.

In Reference Nos. 5 and 6, the inventors disclosed a multi-terminal device fabricated using adjacent device elements formed on a semiconductor wafer. The multi-terminal surge protection device shown in FIG. 12(A) has a configuration corresponding the structure fabricated in accordance with the teachings of Reference No. 6. In this configuration, the second electrode E2 is in common contact with the three surge protection device elements all having the same structure, and is not led off to a terminal connected with an external circuit. On the other hand, with respect to the first electrodes E1 of the device elements, one electrode is connected to line L1, one to line L2, and one to ground E, in order to absorb surges of either polarity between the pair of lines L1 and L2 and between the pair of lines L1 and L2 and ground E. The mutual relationships between the first, second and third regions 11, 12 and 13 are the same as in the sectional structure of the surge protection device element shown in FIG. 10(A). What is different is that there is no ohmic contact region 18 forming a direct contact between the second electrode E2 and the first region 11, and fourth region 14 is not in direct contact with the first region 11, but is in contact via an auxiliary region 53 that is of the same conductivity type as first region 11 and has a high impurity concentration (which in the case of the conductivity arrangement of the illustrated example means $n^+$-type), forming pn junctions. Furthermore, the third region 13 is configured as a plurality of regions arranged in parallel with the aim of achieving uniform current distribution within the device, as has been explained, and this can also apply to the embodiments of the invention described later.

Since there is no ohmic contact region 18 between the second electrode E2 and the first region 11, the each of the elements of the multi-terminal surge protection device shown in FIG. 12(A) exhibits a reverse withstand characteristic upon application of a voltage of reverse polarity. When for example absorbing a surge between line L1 and ground E having a polarity such that the ground E side becomes positive, the surge protection device element with the first electrode E1 connected to the line L1 (in the illustrated example, the one on the left) will be the one in which the breakdown operation is started by reverse bias between the first region 11 and the second region 12. When this is happening the pn junction between the fourth region 14 and the high-concentration auxiliary region 53 of the device element will be forwardly biased and will therefore simply conduct. However, since in the device element in which the first electrode E1 is connected to ground E (the center one), the said pn junction will become reversely biased, it will first start to conduct when the pn junction suffers a Zener or avalanche breakdown. Consequently, the clamp voltage value during surge absorption will be a value that is the sum of the breakdown voltages of the pn junction (region 14 plus region 53). Thus, the application of a reverse-polarity surge will have the same result, a Zener breakdown of the pn junction (of regions 14 and 53) only in the device element shown on the left. This can also be said to be the case with reference to the device element association during absorption of surges between line L1 and ground E, and between lines L1 and L2.

The high-concentration auxiliary region 53 is provided since the breakover current $I_{BO}$ and holding current $I_H$ can be controlled in accordance with the impurity concentration and thickness of the auxiliary region 53, as described in detail in Reference No. 6. An explanation of this is omitted, as it has no direct relation with the present invention. A number of ways of isolating the multiple elements within the device are shown in FIG. 3 of Reference No. 6. In one of these arrangements the device elements are completely isolated down to the second electrode E2 and mounted on a separate substrate, which is substantially the same as the configuration of the surge protection device element shown in FIG. 12(A). In another arrangement, the elements are separated down as far as the auxiliary region 53, while the fourth region 14 is common to all elements. Another arrangement is described in which more or less the same result provided by separation is obtained without the special provision of separated regions, by using sufficient lateral spacing between element devices. However, these all just relate to alternative isolation examples and do not change the operating principle described in the foregoing.

Reference No. 5 discloses a multi-terminal surge protection device in which incorporates the concept of one type of bipolar surge protection device. The device is configured to absorb surges of either polarity between lines L1 and L2 and between the lines and ground E by forming a set of second and third regions 12 and 13 on the top and bottom surfaces of the first region 11. FIG. 12(B) shows the general sectional structure of a multi-terminal surge protection device thus configured. In this configuration, a pair of second and third region 12 and 13 portions are formed on the top surface of the first region 11, and each of this pair of region portions has a first electrode E1 that mutually short-circuits the surfaces of the second and third regions 12 and 13, and one set of second and third regions 12 and 13 together with a second electrode E2 shorting the surfaces of the two regions are formed on the bottom surface of the first region 11. As shown, one of the first electrodes E1 of the top surface pairs is connected to line L1 and the other to line L2, so connecting the second electrode E2 on the bottom surface to ground E results in a multi-terminal surge protection device able to absorb surges of either polarity applied across lines L1 and L2 and across either line and ground E.

The function of the fourth region 14 in the device element described with reference to FIG. 10(A) is performed by the second region 12 according to the polarity of the applied surge and across which electrodes the surge is applied. In the case of the application of a surge having a polarity that results in a positive ground E, for example, and, as shown, the first region 11 is n type so the second region 12 is p type, the pair of second and third region 12 and 13 portions connected to the first electrodes E1 on the top surface will each be involved in the described breakdown operation for absorbing the surge. However, the third regions 13 connected to the second electrode E2 on the bottom surface have no effect and the second region 12 on the bottom surface performs the function performed by the fourth region 14 in the device element of FIG. 10(A). Conversely, when a surge is applied having a polarity that causes the ground E side to go negative, it is the third regions 13 on the top surface that have no function or effect, and the second regions 12 on the top surface that fulfill the role fulfilled by the fourth region 14 in the device element of FIG. 10(A), and the second and third regions 12 and 13 on the bottom surface that have the same function as the second and third regions 12 and 13 of the device element of FIG. 10(A). Also, absorption of surges between lines L1 and L2 is performed by one or the other of the second regions 12 connected to the lines L1 and L2 by first electrode E1; which region 12 depends on the polarity of the surge.

Thus, as shown in equivalent-circuit form in FIG. 11, the incorporation of unipolar surge protection unit devices that do not exhibit a reverse withstand characteristic upon application of a reverse-polarity voltage make it possible to configure relatively easily a compact, bipolar multi-terminal surge protection device able to absorb surges of either polarity between lines and between a line and ground. However, it is difficult to commercially obtain devices that can be relied on, since in most cases this will entail the use of unit device elements cut from different semiconductor wafers that therefore do not have the required degree of similarity in their electrical properties, particularly response characteristics. Even if device elements are fabricated on the same wafer, most unit device elements used to form surge protection devices that are fabricated at places apart from one another on the wafer have characteristics that vary by more than a permissible amount with respect to their application as surge protection devices.

It is difficult to obtain the closely-aligned properties required for the unit surge protection device elements comprising a single multi-terminal surge protection device, such as the conventional device shown in FIG. 12(A), to exhibit a reverse withstand characteristic upon application of reverse-polarity voltages simply by using adjacent unit elements formed on the same wafer. Certainly the provision of an auxiliary region 53 having a high impurity concentration is advantageous for controlling the turn-off characteristics. However, the addition of Zener breakdown voltage and avalanche breakdown voltage to the clamp voltage tends to result in the accumulation of error in terms of the characteristics, leading to increased variation and raising the power dissipation in each device unit. Higher power dissipation reduces the surge absorption capability $I_{PP}$, impeding the provision of practical integrated surge protection devices. Thus, surge protection device elements, even unipolar surge protection device elements, having pn junctions on the bottom surface that exhibit a reverse-polarity withstand voltage cannot be used to form a practical multi-terminal surge protection device. On the bottom surface, a simple structure is best.

It is quite difficult to obtain a high yield with respect to precision fabrication of a device element having a reverse withstand characteristic upon application of reverse-polarity voltages, on the top and bottom surfaces of the first region 11 of the conventional device shown in FIG. 12(B), and it is also difficult to achieve matching of properties on each surface. At the least, it flies in the face of the need to make the structure on a surface (the bottom surface) of a semiconductor substrate as simple as possible. In particular, with respect to its electrical potential the first region 11 constituting the base region of a parasitic transistor, sandwiched between the second regions 12 of the top and bottom surfaces, is in a floating state that is highly susceptible to the effects of differences between the impurity diffusion concentrations of the top and bottom surfaces, which can easily result in deviations in the operating voltages. Also, line-to-ground operation (between L1 and E, and between L2 and E) is a vertical type operation but between lines L1 and L2 it is a lateral type operation, and differences can readily appear between the dynamic characteristics of these operation. Particularly when the localization point effect such as exhibited in an avalanche breakdown or the like is utilized in the initial breakdown phase, parallel operation can readily break down, and even if the time period involved is short, can cause problems such as current concentrations in one line.

An object of the present invention is to provide a multi-terminal surge protection device having the simple configuration shown in equivalent circuit form in FIG. 11 that can resolve or alleviate drawbacks of the conventional devices shown in FIGS. 12(A) and 12(B). In particular, referring to the above-described second electrode E2 in common contact with unit device elements as a common electrode, and the first electrodes E1 in individual contact with a line or ground as individual electrodes, while allowing a slight difference in characteristics between surge protection device elements connected to lines by an individual electrode and surge protection device elements connected to ground by an individual electrode, a principle object is to ensure as far as possible simultaneous operation of surge protection device elements connected to lines by individual electrodes.

SUMMARY OF THE INVENTION

For achieving the above object, the present invention provides a multi-terminal surge protection device able to absorb a surge of either polarity between any two of N lines, where N is an integer of 2 or more, and able to absorb a surge of either polarity between any of the N lines and ground, said multi-terminal surge protection device comprising:

(A) a plurality of unipolar surge protection elements each having a first electrode on a top surface of a semiconductor substrate and a second electrode on a bottom surface of the substrate that initiates a breakdown operation or a breakover operation to absorb a surge applied across the first and second electrodes that causes polarity at the first electrode to become a specific polarity, either positive or negative, and does not exhibit a reverse withstand characteristic upon application of a voltage across the first and second electrodes that causes the first electrode to become the opposite polarity, wherein (B) the plurality of surge protection elements is divided into N+1 sets each comprising one or more surge protection elements;

(C) the first electrodes of the surge protection elements belonging to each of N sets among the N+1 sets are connected to a different one of the N lines;

(D) the first electrodes of the surge protection elements belonging to the remaining set are connected to ground;

(E) the second electrodes of all surge protection elements belonging to the N+1 sets have a common mutual connection;

(F) the semiconductor substrate is a continuous substrate common to all surge protection elements belonging to the N+1 sets; and (G) the surge protection elements belonging to the remaining set and an adjacent set of the N sets of surge protection elements are mutually separated by a separating groove formed in the semiconductor substrate or are separated by providing increased lateral spacing therebetween.

When a groove is used for the separation, the groove can be as deep as midway down through the thickness of the substrate, or it can be formed so that it cuts through the entire thickness of the substrate. When the separation is by lateral spacing, the spacing will normally be at least the thickness of the first semiconductor region to secure the separation function. This function can also be secured by a spacing that is at least twice the diffusion distance of injected minority carriers in the first semiconductor region. This also applies to other aspects of the invention.

The present invention does not use the method of forming a separate region on the other principal surface facing the principal surface of the first semiconductor region by the introduction of an impurity of a different conductivity type from that of the first semiconductor region. A satisfactory separate region as described by this invention cannot be one thus formed as an impurity region, since the uniformity of an introduced impurity cannot be maintained to much of a depth. Thus, in practice it is not feasible to form a separate region such as by the introduction of an impurity in the thickness direction of the first semiconductor region such as is illustrated by FIG. 7 of U.S. Pat. No. 4,282,555. This U.S. Patent also discloses in FIG. 6b a device having a plurality of elements integrated with one another. These element different from those used in the present invention are pnpn two-terminal thyristors each having a reverse withstand characteristic, to which diodes arranged in parallel are respectively connected.

The present invention also proposes an arrangement that actively utilizes the mutual effect between adjacent elements. For this, either or both of the following configurational elements (H) and (I) may be added to the above configurational elements (A) to (G).

(H) Disposition of surge protection elements that belong to different sets but are mutually adjacent so that the elements are in a lateral proximity that is close enough to allow mutual interaction therebetween when absorbing a surge of the same polarity applied to the first electrodes thereof.

(I) The surge protection elements belonging to the remaining set are a plurality of elements with adjacent elements being disposed in a lateral proximity that is close enough to allow mutual interaction therebetween when absorbing a surge of the same polarity applied to the first electrodes thereof.

In contrast to the above-described separation, this is achieved by reducing the lateral distance between elements to or below the thickness of the first region, or to or below twice the diffusion distance of injected minority carriers in the first semiconductor region.

In the multi-terminal surge protection device comprised of the above configurational items (A) to (G), all the constituent device elements are fabricated on a common semiconductor substrate. In accordance with another aspect of the invention, the substrates on which of all of the constituent device elements of N sets are formed are constituted as a continuously-formed, common first substrate, while the substrates of the surge protection elements belonging to the remaining set can be constituted as a continuously-formed, common second substrate that is different from the first substrate. With this configuration, mutual isolation is achieved between surge protection elements of the remaining set and the surge protection elements of the adjacent N sets by the gap between the first and second substrates.

In another aspect of the invention relating to a preferred limitation with respect to the surge protection elements employed, use of surge protection device elements comprised as described below in (J) is proposed with respect to the make-up of sets.

(J) Surge protection elements of the device that are breakover type unipolar surge protection elements that do not exhibit a reverse withstand characteristic upon application of a voltage of reverse polarity, each element being comprised:

by a semiconductor substrate that constitutes a first semiconductor region, a second semiconductor region of opposite conductivity type that forms a rectifying junction with the first substrate and a third region able to inject minority carriers with respect to the second semiconductor region that forms a minority carrier injection junction with the second semiconductor region, said regions being formed on a top surface of the first semiconductor region, with surfaces of the second semiconductor region and third region being shorted by a first or second electrode, a fourth region on a bottom surface of the first semiconductor region able to inject minority carriers with respect to the first semiconductor region that forms a minority carrier injection junction with the first semiconductor region, and ohmic contact between a surface of the fourth region and the first semiconductor region is provided by the electrode not being used to short the surfaces of the second semiconductor region and third region, wherein absorption of surge current is started by initiation of breakdown by application across the first and second electrodes of a voltage that exceeds a breakdown voltage value and has a polarity that reversely biases the second semiconductor region, following which the combined effect of minority carrier injection from the fourth region into the first semiconductor region and minority carrier injection from the third region into the second semiconductor region is that when the surge current that starts to be absorbed becomes greater than the breakover current value, positive feedback within the device gives rise to breakover, and as a result, the voltage across the first and second electrodes shifts to a relatively lower clamp voltage as the surge current is being absorbed.

A multi-terminal surge protection device thus configured in accordance with the invention as described above is provided that is able to absorb surges of either polarity applied between any of a plurality of lines and ground and between any two of the plurality of lines. The operation of the device is improved by improving the simultaneous operating characteristics of surge protection elements connected to each line. Other advantages include that the device can readily be made compact by use of a modular structure (device-chip implementation), it being possible to use a lower-precision process at least with respect to fabrication of one surface of the semiconductor substrate.

The above and other features of the present invention will become from the following description made with reference to the drawings.

BRIEF DESCRIPTION OF THE DRAWINGS

FIG. 11(A) is an equivalent circuit representation of a surge protection device exhibiting the ability to absorb surges of either polarity between a plurality of lines and ground.

FIG. 11(B) is an equivalent circuit representation in which the device elements are of opposite polarity to those of FIG. 11(A) but provide the same function.

FIG. 12(A) is a schematic view of a conventional multi-terminal surge protection device.

FIG. 12(B) is a schematic view of another conventional multi-terminal surge protection device.

DESCRIPTION OF THE PREFERRED EMBODIMENTS

Figure 1:
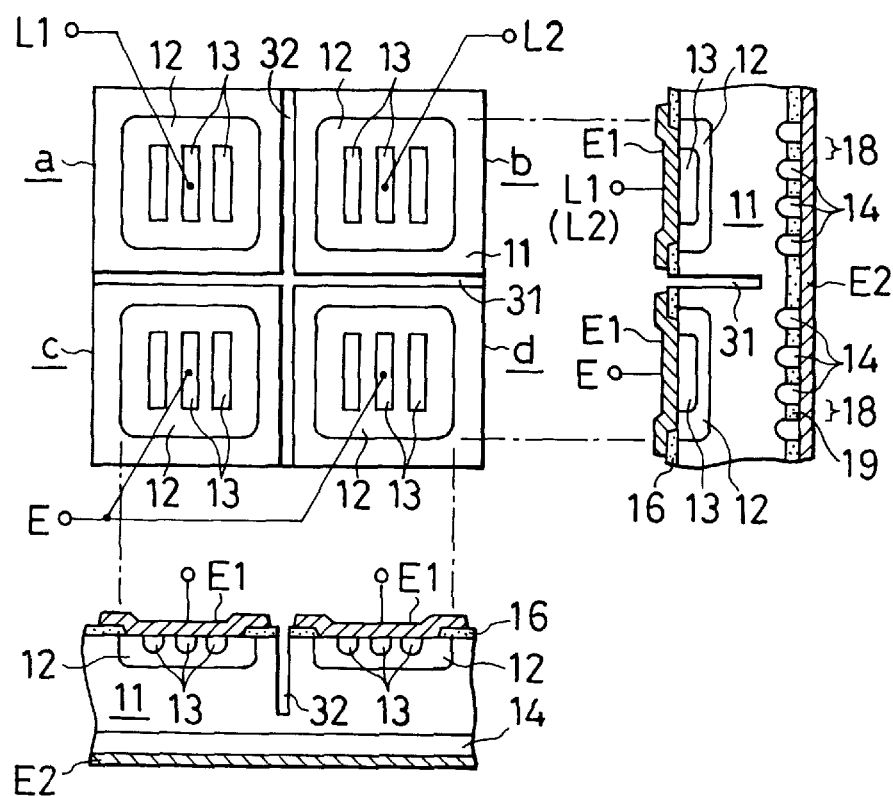
FIG. 1 is schematic view of the configuration of a first embodiment of the surge protection device according to the invention.

Details of the preferred embodiments of the invention will now be described with reference to the drawings. FIG. 1 shows a first embodiment of the invention. The unit surge protection elements a, b, c, d used in this embodiment have the same basic sectional structure and operating principle as those described with reference to FIG. 10(A) and 10(B). Namely, they are unipolar surge protection elements that do not exhibit a reverse withstand characteristic upon application of a reverse-polarity voltage, but instead are breakover type elements that utilize punch-through, preferably between first and third regions 11 and 13, for initial breakdown, and can only absorb surges of a specific polarity. Further descriptions of structural details and operations that have already been given will therefore be omitted. Constituent elements corresponding to those of the arrangement shown in FIG. 10(A) will be assigned the same reference symbols in the explanation of the invention. The relationship between conductivity types of the regions is also the same. Here, the third region 13 and fourth region 14 that, as has been described, are not limited to being semiconductor regions are here shown as semiconductor regions, preferably high-concentration regions.

This embodiment uses four surge protection unit elements (hereinafter also referred to simply as "elements") arranged in pairs (elements a and b, elements c and d) adjacent to each other. The first regions 11 of these elements are all formed from the same semiconductor substrate 11.

The second electrode E2 is in common contact with all of the elements. For this, the electrode is formed on the bottom surface of the first region/semiconductor substrate 11 in a continuous operation by for example vapor deposition of a suitable metal material. In this embodiment the first electrode E1 on the top surface of the first region 11 is formed individually for each of the elements a to d and are then distributed according to which of the three sets each belongs. That is, as indicated by using the same line symbol L1 used in FIG. 11(A) and 11(B), the first electrode E1 of element a shown at the upper left (in the drawing, to simplify the plan view and clearly depict the second region 12 and third region 13, the first electrode E1 is not shown; this also applies to plan views relating to other embodiments) is connected to device terminal L1 as the electrode to be connected to line L1 and element b is connected to terminal L2 as the electrode to be connected to line L2. Elements c and d are both connected to device terminal E for connection to ground E. When, as shown, the first region 11 is constituted as an n-type semiconductor region, this results in the same device configuration depicted in equivalent circuit form by FIG. 11(A). Since elements a and b connected to lines L1 and L2 correspond to elements SPD1 and SPD2 in FIG. 11(A), application of a surge whereby the ground E side becomes positive will cause elements a and b to effect a breakover operation to absorb the surge, while elements c and d corresponding to FIG. 11(A) element SPDc, will merely function as a forward diode. Needless to say, the reverse will apply if a surge of opposite polarity is applied, in which case elements c and d will break over to absorb the surge, and elements a and b will merely function as a forward diode.

Figure 2:
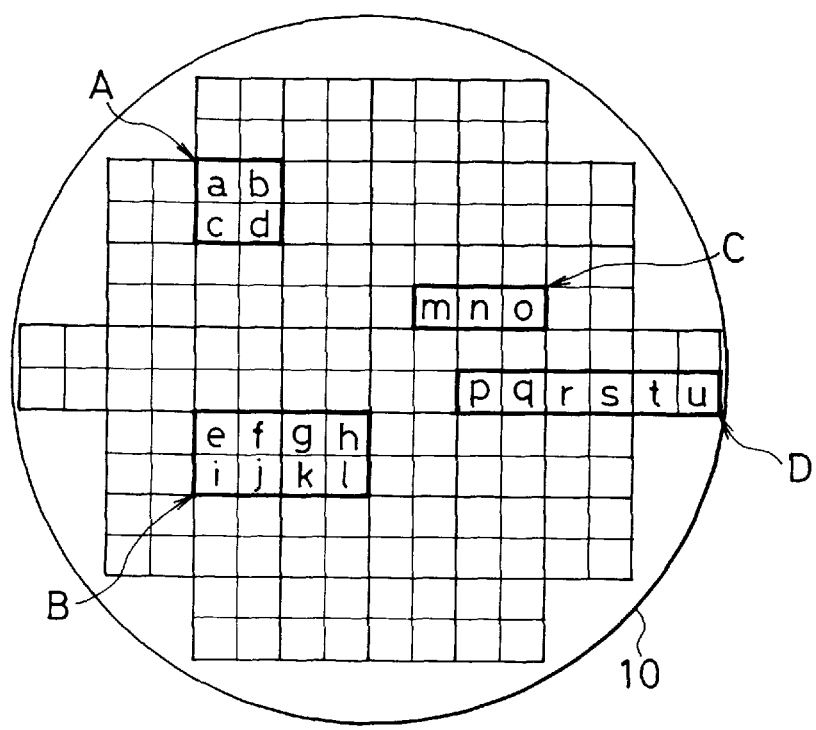
FIG. 2 is a drawing illustrating the acquisition of surge protection device elements from a semiconductor wafer.

The four elements a to d can be obtained as a block of four contiguous elements, such as block A in FIG. 2, from among many elements (usually ranging from several hundred to several thousand) cut from a single semiconductor wafer 10 (the present invention does not directly specify the fabrication process itself, which may be any existing procedure). When a second electrode E2 is used that is in common contact with all of the elements, since there is no need to provide the insulation film 17 on the bottom surface between elements when individual elements are fabricated as shown in FIG. 10 (although the insulation film 17 may still be provided), the second electrode E2 can readily be formed by beta deposition over the whole bottom surface of the wafer. This is quite advantageous.

When the elements a to d forming the starting material for the first region 11 are thus obtained from adjacent locations on the same wafer 10, the difference in element characteristics is reduced. Although the protected circuit 50 may have a high line-to-ground withstand capability, if it has a low line-to-line capability, differences in characteristics between elements a and b, differences in response time, can become a major problem and an obstacle to the commercial provision of the resulting surge protection devices. Since a breakover operation in one of the elements a, b before the other can result in a major normal-mode surge across lines L1 and L2, the use in this invention of elements that were fabricated on the same semiconductor substrate 11, and adjacent to one another, and therefore exhibit uniform characteristics, is highly advantageous in terms of improving the simultaneous operating characteristics.

In this embodiment, elements a and b are isolated from elements c and d by a groove 31. This groove 31 can be formed before or after the elements a to d are cut from the wafer in one block A. The groove 31 can be formed by oxidation of introduced impurities, or by etching, or, more simply, with a dicing saw. This isolation helps to suppress undesirable parasitic lateral operation and interference between the pair of elements a, b connected to the lines and the pair of elements c, d connected to ground E. This also reduces the risk of operating variations caused by line elements a, b being affected by ground elements c, d.

In this embodiment, another groove 32 is formed, maintaining complete independence of all elements by isolating element a from element b, and element c from element d. As described, there is a need to isolate ground elements c, d from line elements a, b. However, as shown, the two elements a and b, or c and d, that are to simultaneously initiate surge absorption operations do not have to be isolated. In fact, as described below, it preferable to have some interaction for improving the simultaneous operating characteristics. Naturally, there will be cases and applications where it is preferable to maintain the independence of the elements as shown in FIG. 1. If for example instead of the illustrated breakover type, the elements a to d were to be breakdown types such as in the case of a constant-voltage diode. When absorbing a voltage between lines L1 and L2 with an arrangement of such simple sectional structure, one side may adversely affect the other. So, in such a case it would be better to use the configuration of the illustrated embodiment.

Techniques of effecting lateral isolation between elements by opening grooves 31, 32 to midway down in the thickness direction of the first region 11, as shown, are public knowledge. Normally forming the grooves to a depth of half the thickness of the first region 11 is enough to provide sufficient suppression of lateral interference between elements, but the deeper the grooves, the more effective the isolation function becomes. On the other hand, the physical support function of the substrate will be stronger if the grooves are shallower. As such, when a strong semiconductor substrate 11 is required, it is better to keep groove depth to a minimum. While not shown, the grooves 31 and 32 may be filled with a suitable insulating material. In practice, it is not possible to form an isolating region to a depth of half the thickness of the first region 11 using impurities introduced from the surface. It is not possible to form impurity separation regions that extend all the way in the thickness direction. Even if it is attempted in two steps, from one surface and then the other, it is difficult to accomplish, and the fabrication process involved is complex.

In the illustrated device, as described, the third region 13 of each of the surge protection elements is constituted as a plurality of regions (three, in the illustrated example) arranged parallel to each other. This is an effective arrangement for achieving a uniform distribution of current and increasing the surge current capability $I_{PP}$. The fourth region 14 is also constituted as a plurality of regions (four per element in the illustrated example) arranged in parallel, again to achieve uniformity of the carrier flow in the device.

The plurality of third regions 13 and the plurality of fourth regions 14 are arranged so as to intersect obliquely or perpendicularly in planar projection. As described in Reference No. 11, this layout further enhances the uniformity of the carrier current in of the first region 11 and also improves the surge current capability $I_{PP}$. This is because the carrier flow is like a sprinkler or shower. In this embodiment, also, a fourth region 14 is not formed individually for each element. Instead, it is formed as strips, with one strip for both elements a and b, and one strip for both elements c and d. This has no particular significance other than simplifying the fabrication process, since adjacent elements are effectively isolated by the grooves 31 and 32. However, it is better to arrange the third regions 13 in the direction shown, and to arrange the fourth regions 14 perpendicular thereto so that the fourth regions 14 extend across the line elements a and b. If instead the strip-shaped fourth regions 14 are arranged across elements a and c and b and d, i.e., across two elements in which, when a surge is applied, one will operate to absorb the surge (a breakover operation, in this case) and the other will operate as a forward diode, there is some possibility of interference arising between the elements.

Figure 10A:
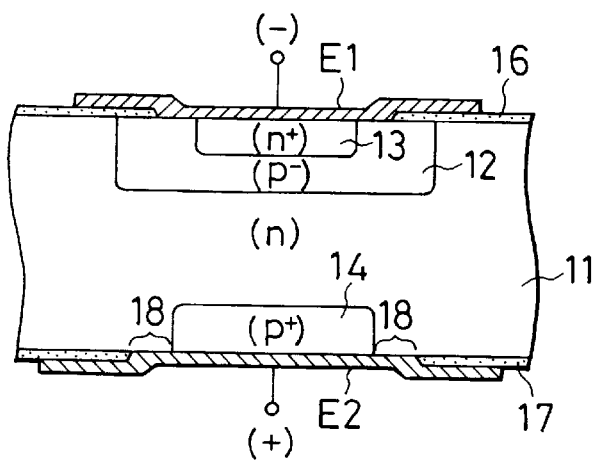
FIG. 10(A) is a sectional view of the basic structure of a surge protection element for use in the invention.
Figure 10B:
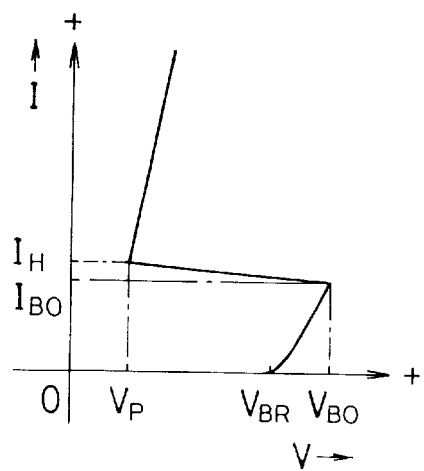
FIG. 10(B) is a diagram illustrating the operation of the device of FIG. 10(A).

The configuration of FIG. 1 includes a high-concentration impurity region 19 (an $n^+$ type region) which is not included in the configuration of FIG. 10(A), and is provided where ohmic contact region 18 is located. This region 19 is for improving the ohmic contact between the second electrode E2 and the first region 11. In the case of the elements used in the device of this invention, the structure of the bottom surface can be fabricated at a relatively low level of precision. This is because, via the second electrode E2, the fourth regions 14 are structures that electrically short all elements with the common first region 11, and the second electrode E2 is not provided with a terminal for external connection. As mentioned, fabrication of the second electrode E2 can be simplified by using beta deposition or the like.

Figure 3:
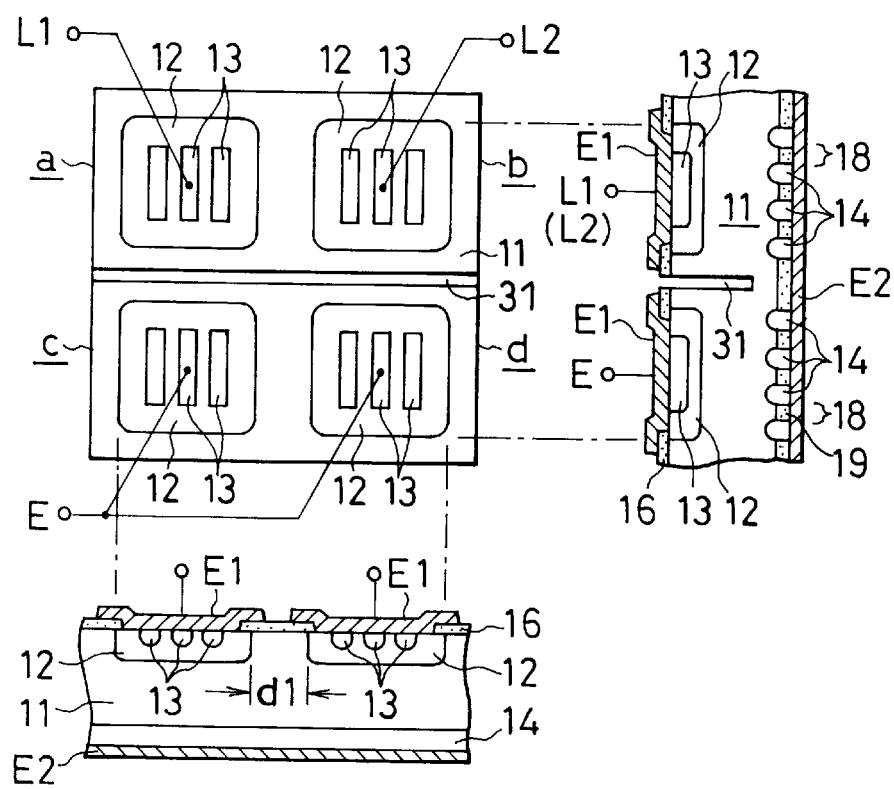
FIG. 3 is a schematic view of a second embodiment of the invention.

FIG. 3 shows a second embodiment of the invention. Constituent elements corresponding to the device elements a to d of FIG. 1 are assigned the same reference symbols with reference to the explanation of this embodiment. Any descriptions already given that also apply here are not repeated here, and this also applies to the description of other embodiments given hereinbelow.

The principal difference between the first embodiment of FIG. 1 and this embodiment is that while this embodiment has a groove 31 as a region of isolation between the pair of line elements a and b and the pair of ground elements c and d, there is no visible region of isolation between element a and element b, and between element c and element d, such as a groove or the like. The pairs of elements set side by side are simply isolated by being positioned apart by a distance d1. This sectional structure can actually be used to form two configurations. In one, a sufficient value of distance d1 is used that produces a state of isolation between adjacent elements substantially equivalent to that provided by the groove 32 of FIG. 1. In the case of the illustrated surge protection element, separating adjacent elements by a distance d1 that is two or more times the lateral diffusion distance of minority carriers injected into from the fourth region 14 into the first region 11, will substantially isolate the elements. Or, adjacent elements can be substantially isolated by using a distance d1 between elements that is more than the vertical distance between the second and fourth regions 12 and 14, or more than the thickness of the first region 11 plus a tolerance value.

Conversely, if anything it can be desirable to actively set line elements a and b closer together to produce interaction therebetween. As explained above, in effecting a surge absorption operation (breakover operation, in this case) by both elements a and b when a common-mode surge is first applied, a loss of simultaneous operating characteristics can give rise to normal-mode surge, exceeding the line-to-line withstand voltage value of a protected circuit 50 (FIG. 11), which tends to be set relatively low compared to the line-to-ground withstand value. By reducing the distance d1 between adjacent elements, in cases where slight variation in the characteristics is allowed, minority carriers injected from the fourth region 14 into the first region 11 can also be expected to flow into the element with the slower operating characteristics and collect there, enhancing the simultaneous operating characteristics by speeding up the operation of that element. According to actual experiments conducted by the inventors, the simultaneous operating characteristics were improved when the distance d1 between adjacent elements a and b was reduced to below the thickness of the first region 11, or to below twice the lateral diffusion distance of minority carriers in the first region 11. When this element interaction is anticipated, arranging the third regions 13 perpendicularly to the fourth regions 14 and forming the fourth regions 14 as strip-shaped portions common to adjacent elements a and b, as has been described, helps to simplify the fabrication process and is an effective way of promoting interaction.

When the elements connected to ground E number two or more, as in the illustrated configuration, such interaction contributes to the improvement of the simultaneous operating characteristics. While there may be some difference in operation time among the multiple elements connected to ground, it will not become a problem with respect to the line-to-line withstand capability. More to the point is that excluding interaction based on minority carrier flow in the first region by isolating line elements a and b from ground elements c and d has a stronger effect that contributes to rapid turn-off of the surge protection device after the surge has subsided. A short turn-off time is regarded as one of the important characteristics of this type of surge protection device.

Figure 4:
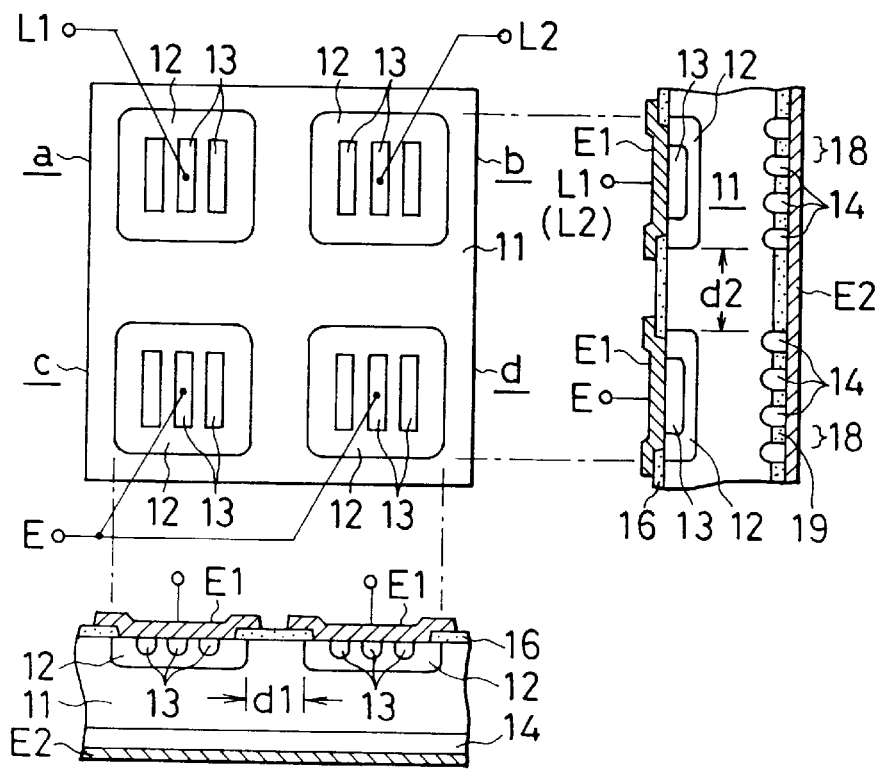
FIG. 4 is a schematic view of a third embodiment of the invention.

FIG. 4 shows a third embodiment of the invention. Focusing mainly on the difference compared to the preceding embodiments, in this embodiment there is no groove or other such visible isolation region, either between the line elements a and b and between the two ground elements c and d, or between the set of elements a and b and the set of elements c and d. As described, it is desirable to mutually isolate the set of elements a and b and the set of elements c and d. This is accomplished by using a sufficient value for isolation distance d2. Namely, these sets of elements a and b, and c and d are isolated by using a distance d2 that is greater than the thickness of the first region 11 or more than twice the lateral diffusion distance of minority carriers in the first region 11. It is at least desirable to effect interaction between line elements a and b, so to secure this interaction the distance d1 between those elements is reduced, for example to less than the thickness of the first region 11, or to less than twice the lateral diffusion distance of minority carriers in the first region 11.

Figure 5:
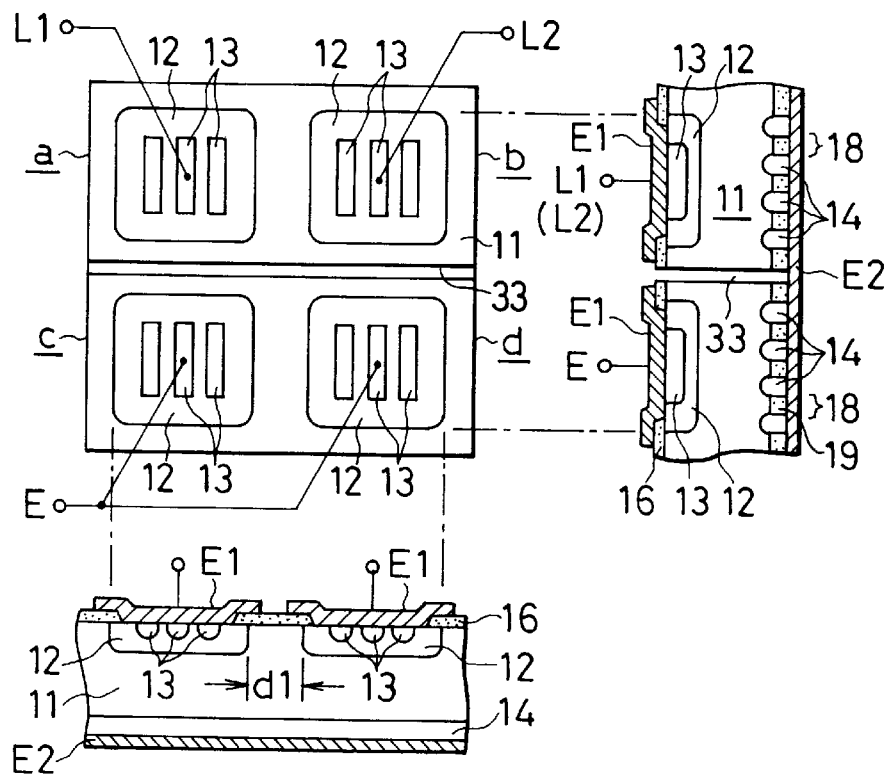
FIG. 5 is a schematic view of a fourth embodiment of the invention.

In another embodiment of the invention, shown in FIG. 5, the distance d1 between elements a and b and between elements c and d has been reduced to a distance that promotes interaction therebetween. Isolation between the set of elements a and b and the set of elements c and d is accomplished by a groove 33 formed depthwise in the semiconductor substrate/first region 11. With this configuration, in practice it is difficult to maintain the mechanical support strength of the elements using just the common second electrode E2. Usually, therefore, it is necessary to use a backing plate such as conductive plate 35, constituted as a plate of a suitable metal having a suitable thickness. This plate 35 also functions as a heat radiator of the surge protection device of the invention. As such, the plate 35 can be advantageously employed in the preceding and following embodiments, provided in contact with the second electrode E2, for mounting the elements thereon.

The configuration of this embodiment points the way to further developments in the structure of the surge protection device of the invention. Namely, as mentioned several times before, the simultaneous operating characteristics between line elements a and b is a critical factor, while the permissible range of difference between the characteristics of the ground elements c and d can be quite large. When sets of elements are fully isolated such as by groove 33, different substrates can be used for the elements a and b, and elements c and d. That is to say, elements a and b do not have to be cut from the same wafer 10 as elements c and d. The fact that not all of the elements have to have the same shape and structure has been mentioned. Using the same shape and structure to fabricate all of the elements is certainly preferable, since it simplifies the designing of the masks used to form each region and the like. However, from the standpoint of surge current capability $I_{PP}$, it can be preferable to separately fabricate the device elements connected to ground.

To explain: the embodiments described so far have an element connected to each of the lines L1 and L2, but two elements connected to ground, these two elements being connected in parallel. In terms of the structural geometry, maintaining symmetry facilitates fabrication and the achievement of uniform characteristics, and also simplifies the structure of lead frames, as described below. For these and other reasons, it has many advantages with respect to surge protection devices provided on a commercial basis. Then there is the matter of the surge current capability $I_{PP}$. As is clear from FIG. 11(A) and 11(B), during absorption of a common-mode surge, the current that flows in both of the line-side elements SPD1 and SPD2 combined flows through the ground-side terminal SPDc, so in principle, the device element SPDc needs to have twice the surge current capability of each of the elements SPD1 and SPD2. This being the case, it is meaningful to have two elements connected to ground E, as in the preceding embodiments.

Doubling the device surge current capability of the surge protection device cut from the wafer as block A by connecting two line elements in parallel to each of the lines L1 and L2 can be accomplished by cutting a block of eight device elements e to 1, for example, having a common semiconductor substrate, such as in block B of FIG. 2, connecting both of the first electrodes of elements e and f to one device terminal L1 (the ground E symbol and the line symbols used in FIG. 11(A) and 11(B) are also used to refer to device terminals in FIGS. 1 to 6) which is connected to line L1, connecting both of the first electrodes of elements g and h to one device terminal L2 which is connected to line L2, connecting the remaining four elements i to l together in parallel and connecting them to one device terminal E, and connecting that to ground E. Generally speaking, when each of the elements used has the same surge current capability, the number of lines is not limited to two (L1 and L2) but is N, and the number of elements in each set to be connected in parallel with each line Light (i=1, 2, 3 ..., N) is M, then the number of elements that should be connected to ground E is MN. However, since the first electrodes E1 of the elements to be connected to ground E are all connected to device terminal E, in principle it is not necessary for each of them to be independent. It is not even necessary for the second regions 12 or third regions 13 to be independent. To put it another way, providing the ground side elements with a surge current capability that is the same as the sum of the surge current capabilities of all the elements attached to the lines L1 and L2 can be accomplished by using a single element with a large area.

Figure 6:
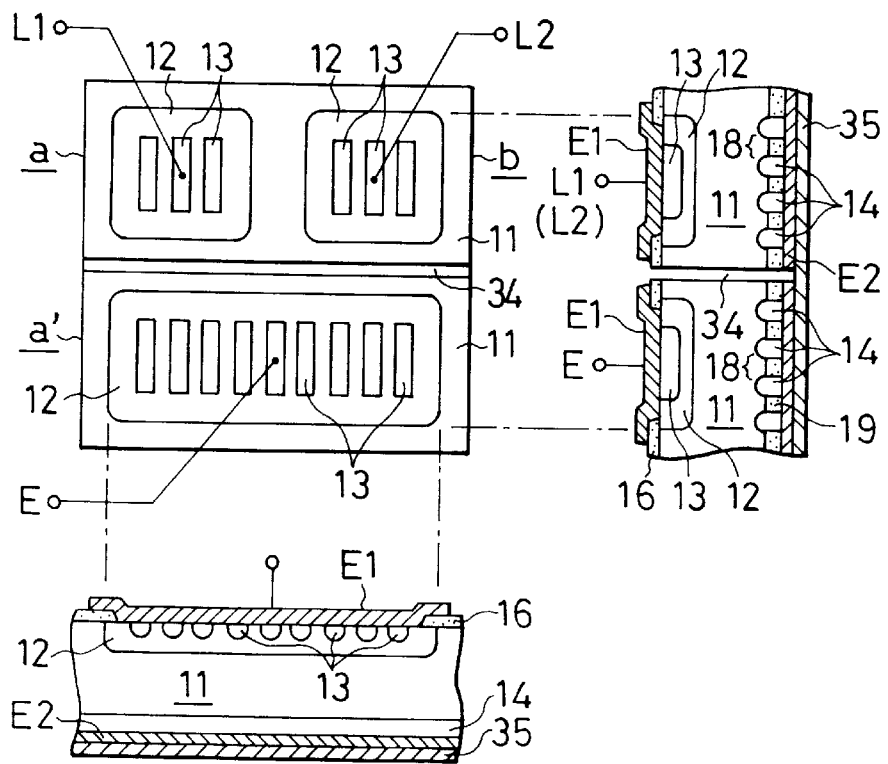
FIG. 6 is a schematic view of a fifth embodiment of the invention.

FIG. 6 shows an embodiment according to this thinking, in which the area of the ground element a' is substantially twice that of the line elements a, b, and therefore has substantially twice the surge current capability. The surge current capability of a surge protection element, including one having the illustrated structure, is normally proportional to the area of the element. Thus, if the total number of elements to be connected to lines L1 to LN is MN, then the area of a single element a' connected to ground E should be twice that of the MN elements. In the case of the arrangement shown in FIG. 6, the surge protection device of the invention can be configured by using a common first semiconductor substrate 11 for the line elements a and b (that is, cut from the same wafer 10), using for the large ground-side element a' second substrate cut from a different wafer, and mounting the first and second substrates on a conductive plate 35 that is in common contact with the second electrodes E2 of the first and second substrates with a space 34 between elements.

Using a single element that has extra surge current capability can be accomplished by taking three adjacent elements from the same semiconductor substrate 10, such as block C elements m, n, o shown in FIG. 2, providing an isolation region between elements n and o, for example, and connecting element o to ground E and elements m and n to lines L1 and L2. To double the surge current capability, a row of six adjacent elements can be taken from the one substrate 10 such as elements p to u of block D in FIG. 2, an isolation region provided between elements s and t, for example, elements t and u connected to ground E, elements p and q connected to line L1 and elements r and s connected to line L2. The following describes providing a surge protection device according to the invention by cutting a desired number of adjacent elements from the same semiconductor wafer and providing appropriate isolation regions between elements, in which the number of elements is estimated based on the required surge current capability and the surge current capability of each element.

Figure 7:
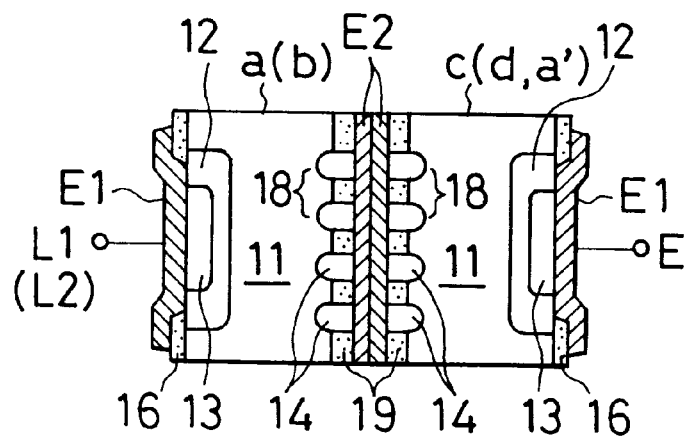
FIG. 7 is a schematic view of a sixth embodiment of the invention.

Line elements and ground elements fabricated using different semiconductor substrates, as in the configurations of FIGS. 5 and 6, can be used to configure a surge protection device according to this invention using the arrangement shown in FIG. 7, in which second electrodes E2 of different substrates are arranged face to face to achieve electrical contact. This arrangement is the equivalent of folding the elements of the lower part of FIG. 5 and FIG. 6 over 180 degrees, down onto the top part, along the groove 33 in the case of FIG. 5 or along space 34 in the case of FIG. 6. Solder or the like can be used to bond the contact areas of the electrodes E2 together, electrically and physically. In the case of this back-to-back contact structure, the fourth regions 14 of the line elements a and b need not be arranged in the same direction as the fourth regions 14 of the ground elements c and d/a', but can instead be arranged perpendicularly to each other, and this also applies to the third regions 13.

Figure 8A:
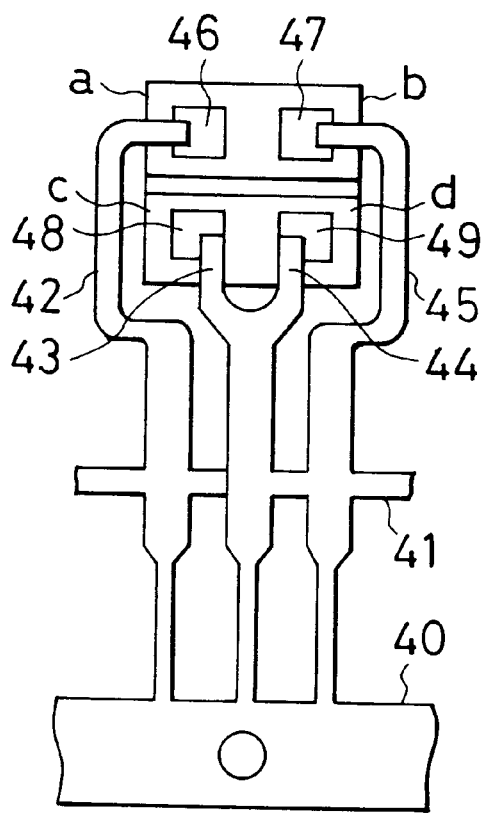
FIG. 8(A) is a plan view of a lead-frame arrangement applicable to the device of the invention.

FIG. 8 shows a suitable lead frame configuration to use in the fabrication of the embodiments of the surge protection device of the invention described with reference to FIGS. 1 to 6. The elements a to d in the embodiments are rectangular, virtually square, and devices using four of these are themselves rectangular, virtually square. This makes it easy to use a symmetrical lead frame with leads 42 to 45 to connect to the first electrodes of the four elements a to d. As shown in the plan view of FIG. 8(A), lead 42 for connecting element a has a contact pad 46 that contacts the first electrode of element a, and from the pad 46 extends out and down along the left side and connects to frame 40. Lead 45 for connecting element b has a contact pad 47 that contacts the first electrode of element b, and from the pad 47 extends out and down along the right and connects to the frame 40. Leads 43 and 44 for connecting elements c and d have contact pads 48 and 49 that contact the first electrode of elements c and d, and from the pads 48 and 49 the leads 43 and 44 extending toward the frame 40 are joined together midway to the frame 40 to form a single lead that is connected to the frame 40. The resulting three leads are parallel, symmetrical to each side of the center line of the middle lead, and linked together by a median tie-bar 41. Lead frames having this plan configuration can be obtained using conventional process technology, punched from metal sheet, photolithography or the like.

Figure 8B:
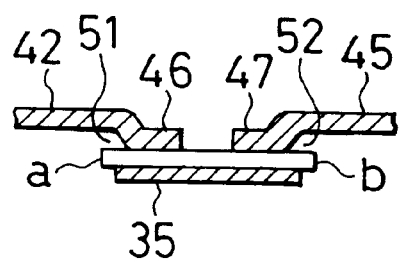
FIG. 8(B) is a side view of the lead-frame shown in FIG. 8(A).

As shown in FIG. 8(B), the portions with the contact pads 46 to 49 of leads 42 to 45 are stepped with respect to the leads, forming spaces 51 and 52 between the underside of the leads and the surface of the elements. While FIG. 8(B) is a sectional view of the portion with elements a and b, the portion with elements c and d has the same spaces. When the contact pad of each lead is soldered to the first electrode of each element, the presence of the spaces 51 and 52 reduces the risk of any excess solder producing shorts by flowing down to the bottom surface or to adjacent elements. The three-dimensional configuration of the lead frame can be formed using conventional techniques, and conventional pressing can be used to bend the leads to form the spaces 51 and 52.

After the leads have been attached, the principal portions of the elements are packaged in resin or the like and the tie-bar 41 and frame 40 are cut off to leave leads of a suitable length that constitute device terminals, thus completing the device of the invention. One of these leads is used to provide a connection to ground, while the other two are for providing a connection to lines. The device of the invention can of course be configured to protect circuits having more lines. In that case too, each of the leads should be shaped to provide a space corresponding to spaces 51 and 52.

Figure 9:
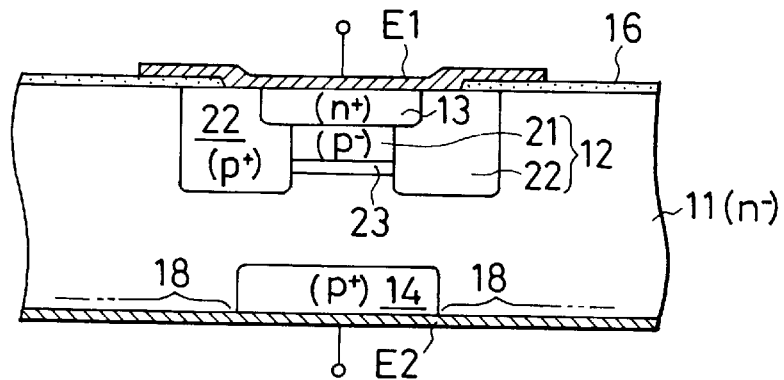
FIG. 9 is a schematic view of another example of a surge protection element of the invention.

Numerous modifications and variations of the surge protection device of the present invention, which is not limited to the illustrated embodiments. As prescribed in the structural gist of the invention, any surge protection elements can be used that do not exhibit a reverse withstand characteristic upon application of a voltage of reverse polarity. Thus, a simple breakdown type surge protection element may be used such as a constant-voltage diode, or in the case of a breakover type, even one that uses avalanche or Zener breakdown instead of punch-through to initiate breakdown. In using a breakover type surge protection element that utilizes punch-through, in accordance with the teaching of Reference No. 12, and the technical concept disclosed by Japanese Patent Application No. Hei 8-61631, filed by the inventors but not yet published, it is preferable to use an element having the type of sectional structure shown in FIG. 9. In this element, second region 12 is comprised of a punch-through generation region 21 and a punch-through suppression region 22, and the punch-through generation region 21, punch-through generation region 21 being provided only facing the first and third regions so as to realize uniform punch-through. The punch-through suppression region 22 is provided so that it covers a corner portion of the third region 13. This makes it possible to limit punch-through generation to a thick region where there is little deviation from design specification values, resulting in device element characteristic values that are close to the design specification values. As indicated in the drawing, punch-through generation and suppression regions 21 and 22 can be differentiated by for example making punch-through generation region 21 a region having a relatively low concentration of impurity ($p^-$ type region) and punch-through suppression region 21 a region having a relatively high concentration of impurity ($p^+$ type region). In addition (or instead), again as shown in FIG. 9, region 22 can be made thicker than region 21. Further details relating to limiting punch-through generation to a specific region can be found in Reference No. 12.

Still with reference to the element shown in FIG. 9, in accordance with the technical concept of Japanese Patent Application No. Hei 8-61631, a region 23 of uniformly high impurity concentration is provided where punch-through generation region 22 faces first region 11. As described above, there can be a considerable difference in the resistivity of center and peripheral portions of the same wafer, so this is an attempt to reduce this difference. If for example the first region 11 formed from a wafer 10 (FIG. 2) is used having a slightly low concentration ($n^-$), n type region 23 is produced by uniform introduction of impurity into the wafer 10, to thereby try to suppress differentials in characteristics no matter what the position on the wafer 10. However, the region 23 of uniformly high impurity concentration is only provided punch-through generation region 21, which has a number of advantages in terms of the fabrication processes used such as the self-alignment technique and also increases the voltage resistance of the pn junction between regions 12 and 13 (the diffusion depth can also be increased, which can also be expected to improve the voltage resistance). This gives rise to a number of benefits, such as that it eliminates the need to use a guard ring, a region having a high impurity-concentration and the opposite polarity to region 11, which has normally been used around regions 12 and 13 to improve voltage resistance. However, this configuration is not limitative, and it can be used to cover the whole periphery of the second region 12, or across more than the thickness of the wafer 10, or can be formed across the whole of the wafer 10 by the prior planned introduction of impurities.

It is to be understood that the invention may be practiced otherwise than as specifically described herein and changes and modifications freely made so long as these do not depart from the defined gist of the invention. Device elements may be fabricated using regions having opposite conductivity arrangements to those shown in the illustrated examples. Also, which of the first and second electrode E1 and E2 are individual electrodes and which are common electrodes may be reversed with respect to the illustrated examples, so that, for example, the electrode used to short the top surfaces of the second and third regions is the second electrode, and individually-formed first electrodes used to connect fourth region 14 and ohmic contact region 18.

What is claimed is:

1. A multi-terminal surge protection device able to absorb a surge of either polarity between any two of N lines, where N is an integer of 2 or more, and able to absorb a surge of either polarity between any of the N lines and ground, said multi-terminal surge protection device comprising:

a plurality of unipolar surge protection elements each having a first electrode on a top surface of a semiconductor substrate and a second electrode on a bottom surface of the substrate that initiates a breakdown operation or a breakover operation to absorb a surge applied across the first and second electrodes that causes polarity at the first electrode to become a specific polarity, either positive or negative, and does not exhibit a reverse withstand characteristic upon application of a voltage across the first and second electrodes that causes the first electrode to become the opposite polarity, wherein the plurality of surge protection elements is divided into N+1 sets each comprising one or more surge protection elements;

the first electrodes of the surge protection elements belonging to each of N sets among the N+1 sets are connected to a different one of the N lines;

the first electrodes of the surge protection elements belonging to the remaining set are connected to ground;

the second electrodes of all surge protection elements belonging to the N+1 sets have a common mutual connection;

the semiconductor substrate is a continuous substrate common to all surge protection elements belonging to the N+1 sets; and the surge protection elements belonging to the remaining set and an adjacent set of the N sets of surge protection elements are mutually separated by a separating groove formed in the semiconductor substrate or are separated by providing increased lateral spacing therebetween.

2. A multi-terminal surge protection device according to claim 1, wherein surge protection elements that belong to different sets but are mutually adjacent are disposed in a lateral proximity that is close enough to allow mutual interaction therebetween when absorbing a surge of the same polarity as the first electrodes.

3. A multi-terminal surge protection device according to claim 1, wherein the surge protection elements belonging to the remaining set are a plurality of elements with adjacent elements being disposed in a lateral proximity that is close enough to allow mutual interaction therebetween when absorbing a surge of the same polarity as the first electrodes.

4. A multi-terminal surge protection device according to claim 1, wherein the semiconductor substrate that is a common continuous substrate has first and second electrodes on its top and bottom surfaces and all adjacent surge protection elements are mutually isolated.

5. A multi-terminal surge protection device according to claim 1, wherein each of the surge protection elements are breakover type unipolar surge protection elements that do not exhibit a reverse withstand characteristic upon application of a voltage of reverse polarity, each element comprising:

a semiconductor substrate that constitutes a first semiconductor region, a second semiconductor region of opposite conductivity type that forms a rectifying junction with the first substrate and a third region able to inject minority carriers with respect to the second semiconductor region that forms a minority carrier injection junction with the second semiconductor region, said regions being formed on a top surface of the first semiconductor region, with surfaces of the second semiconductor region and third region being shorted by a first or second electrode, a fourth region on a bottom surface of the first semiconductor region able to inject minority carriers with respect to the first semiconductor region that forms a minority carrier injection junction with the first semiconductor region, and ohmic contact between a surface of the fourth region and the first semiconductor region is provided by the electrode not being used to short the surfaces of the second semiconductor region and third region, wherein absorption of surge current is started by initiation of breakdown by application across the first and second electrodes of a voltage that exceeds a breakdown voltage value and has a polarity that reversely biases the second semiconductor region, following which the combined effect of minority carrier injection from the fourth region into the first semiconductor region and minority carrier injection from the third region into the second semiconductor region is that when the surge current that starts to be absorbed becomes greater than the breakover current value, positive feedback within the device gives rise to breakover, and as a result, the voltage across the first and second electrodes shifts to a relatively lower clamp voltage as the surge current is being absorbed.

6. A multi-terminal surge protection device according to claim 5, wherein the initiation of breakdown is produced when a reverse bias across the rectifying junction formed between the first and second semiconductor regions causes a depletion layer to grow and reach the third region.

7. A multi-terminal surge protection device according to claim 5, wherein the initiation of breakdown is produced by Zener or avalanche breakdown caused by a reverse bias across the rectifying junction formed between the first and second semiconductor regions.

8. A multi-terminal surge protection device able to absorb a surge of either polarity between any two of N lines, where N is an integer of 2 or more, and is able to absorb a surge of either polarity between any of the N lines and ground, said multi-terminal surge protection device comprising:

a plurality of unipolar surge protection elements each having a first electrode on a top surface of a semiconductor substrate and a second electrode on a bottom surface of the substrate that initiates a breakdown operation or a breakover operation to absorb a surge applied across the first and second electrodes that causes polarity at the first electrode to become a specific polarity, either positive or negative, and does not exhibit a reverse withstand characteristic upon application of a voltage across the first and second electrodes that causes the first electrode to become the opposite polarity, wherein the plurality of surge protection elements is divided into N+1 sets each comprising one or more surge protection elements;

the first electrodes of the surge protection elements belonging to each of N sets among the N+1 sets are connected to a different one of the N lines;

the first electrodes of the surge protection elements belonging to the remaining set are connected to ground;

the second electrodes of all surge protection elements belonging to the N+1 sets have a common mutual connection;

the semiconductor substrate is a continuous first substrate common to all surge protection elements belonging to the N sets;

the semiconductor substrate of the surge protection elements belonging to the remaining set is a continuous, common second substrate that is different from the first substrate; and the surge protection elements belonging to the remaining set are mutually isolated from adjacent surge protection elements belonging to the N sets by an isolating space between the first and second semiconductor substrates.

9. A multi-terminal surge protection device according to claim 8, wherein the second electrode provided on the first semiconductor substrate and the second electrode provided on the second semiconductor substrate face each other in mutual electrical contact.

10. A multi-terminal surge protection device according to claim 8, wherein surge protection elements that belong to different sets but are mutually adjacent are disposed in a lateral proximity that is close enough to allow mutual interaction therebetween when absorbing a surge of the same polarity as the first electrodes.

11. A multi-terminal surge protection device according to claim 8, wherein the surge protection elements belonging to the remaining set are a plurality of elements with adjacent elements being disposed in a lateral proximity that is close enough to allow mutual interaction therebetween when absorbing a surge of the same polarity as the first electrodes.

12. A multi-terminal surge protection device according to claim 8, wherein the semiconductor substrate that is a common continuous substrate has first and second electrodes on its top and bottom surfaces and all adjacent surge protection elements are mutually isolated.

13. A multi-terminal surge protection device according to claim 8, wherein each of the surge protection elements are breakover type unipolar surge protection elements that do not exhibit a reverse withstand characteristic upon application of a voltage of reverse polarity, each element comprising:

a semiconductor substrate that constitutes a first semiconductor region, a second semiconductor region of opposite conductivity type that forms a rectifying junction with the first substrate and a third region able to inject minority carriers with respect to the second semiconductor region that forms a minority carrier injection junction with the second semiconductor region, said regions being formed on a top surface of the first semiconductor region, with surfaces of the second semiconductor region and third region being shorted by a first or second electrode, a fourth region on a bottom surface of the first semiconductor region able to inject minority carriers with respect to the first semiconductor region that forms a minority carrier injection junction with the first semiconductor region, and ohmic contact between a surface of the fourth region and the first semiconductor region is provided by the electrode not being used to short the surfaces of the second semiconductor region and third region, wherein absorption of surge current is started by initiation of breakdown by application across the first and second electrodes of a voltage that exceeds a breakdown voltage value and has a polarity that reversely biases the second semiconductor region, following which the combined effect of minority carrier injection from the fourth region into the first semiconductor region and minority carrier injection from the third region into the second semiconductor region is that when the surge current that starts to be absorbed becomes greater than the breakover current value, positive feedback within the device gives rise to breakover, and as a result, the voltage across the first and second electrodes shifts to a relatively lower clamp voltage as the surge current is being absorbed.

14. A multi-terminal surge protection device according to claim 13, wherein the initiation of breakdown is produced when a reverse bias across the rectifying junction formed between the first and second semiconductor regions causes a depletion layer to grow and reach the third region.

15. A multi-terminal surge protection device according to claim 13, wherein the initiation of breakdown is produced by Zener or avalanche breakdown caused by a reverse bias across the rectifying junction formed between the first and second semiconductor regions.

* * * * *